United States Patent [19]
Kertesz et al.

[11] 4,282,083
[45] Aug. 4, 1981

[54] PENNING SPUTTER SOURCE

[75] Inventors: Gábor Kertész; György Vágó, both of Budapest, Hungary

[73] Assignee: Hirada Stechnikai Ipari Kutato Intezet, Budapest, Hungary

[21] Appl. No.: 121,135

[22] Filed: Feb. 13, 1980

[30] Foreign Application Priority Data

Feb. 19, 1979 [HU] Hungary ............................. HI 507

[51] Int. Cl.³ ............................................ C23C 15/00
[52] U.S. Cl. .................. 204/298; 204/192 R
[58] Field of Search ............................ 204/192 R, 298

[56] References Cited

U.S. PATENT DOCUMENTS

| | | | |
|---|---|---|---|
| 3,956,093 | 5/1976 | McLeod | 204/192 |
| 4,046,660 | 9/1977 | Fraser | 204/192 C |
| 4,060,470 | 11/1977 | Clarke | 204/192 R |

*Primary Examiner*—Aaron Weisstuch

[57] ABSTRACT

The invention relates to a Penning sputter source which utilizes the Penning gas discharge for producing thin films by sputtering. The invented device guarantees a great productivity and effectiveness of the sputtering process by means for equalizing the magnetic field over the device and by increasing the surface of the active zone of the device. The produced layers are of equal thickness, can be composed of alloys of required composition and produced also on plastic substrates having low thermostability.

13 Claims, 5 Drawing Figures

PENNING SPUTTER SOURCE

BACKGROUND OF THE INVENTION

The invention relates to a Penning sputter source comprising an anode, a cathode which is separated from the anode and forms a target, an exciting magnet, a system for cooling the target and a screen system which preferably forms the outer housing of the sputter source. The proposed Penning sputter source can be preferably used in the production of semiconductor thin films and assures uniform sputtering with a good effectiveness.

According to the present level of technology in the electronics industry two kinds of vacuum methods are used for producing thin films, namely the vaporizing and sputtering methods.

Up to the beginning of the 1970's the vaporizing methods, particularly the electronbeam vaporizing techniques had a general acceptance. These methods are very effective in producing monolithic semiconductor thin films having a homogenous structure and formed on thermostable substrates. The disadvantage of these methods lies in the great temperature used for vaporization. Different metals have different partial pressures at the temperature of vaporization which renders the production of alloy layers difficult. During the vaporization a great quantity of heat is released; therefore the use of light plastic substrates is limited. The impact of electron beams on the vaporized material results in X-ray radiation and this radiation can spoil the characteristics of the sensitive semiconductor MOS structures.

The sputtering methods are more advantegous in producing alloy layers. A further advantage of these methods is the possibility of producing layers on plastic substrates. The sputtered thin films are of better quality than the vaporized ones and their production technology is preferable in comparison with the vaporization methods.

The first sputtering methods were based on the well-known cathode sputtering effect which occurs in electron tube structures containing diodes or triodes. These methods show a low speed and a low effectiveness of production. Their main advantages are small quantity of released heat, the absence of electron beams and of their associated X-ray radiation, and their great scattering (the sputtered material is scattered in a large beam, therefore good quality step coverages can be made with a uniform thickness of the layer).

New sputtering methods and devices were developed on the basis of field emission for increasing the speed and the effectiveness of the technological processes. The basic idea of these methods and devices is the exploitation of the Penning gas discharge in a vacuum, which by means thereof the effectiveness of the field emission may be sufficiently increased.

According to the Penning methods of plasma generation, a cathode to be sputtered and an anode are situated in a preliminary vacuum space comprising discharge gas, generally noble gas, suitably argon. The anode and the cathode are exposed to a stable magnetic field and connected to a direct current supply unit giving a direct current of a value preferably within the range of 400 and 800 V. In this way, an electric field is generated around the device being situated in the stable magnetic field as mentioned above. The discharge gas, whose atoms thereof are ionized for sputtering the material of the cathode, can be composed also of reactive gases. In this case chemical compounds also can be condensed on the carrier plate, for example, for producing isolating layers. The magnetic field is directed parallel to the surface of the cathode and has a value being greater then a threshold value which depends on the material of the cathode and on other conditions. In a preliminary vacuum within the range of 0.1 and 1 Pa the suitable range of the magnetic field intensity is of 0.01 and 0.025 T (tesla). This magnetic field gives a remarkable increase of the intensity of the field emission.

The anode and the cathode, as mentioned above, are connected to a direct current supply unit giving a potential difference of required value. For generating the magnetic field a permanent magnet or an electromagnet is used. In the magnetic field the electrons move on a spiral trajectory therefore traversing a longer distance than the distance between the cathode and the anode. The probability of the ionization of the atoms in the discharge gas increases with the length of the trajectory of the electrons. In the magnetic field the ionized atoms are impacted onto the surface of the cathode which forms the target. The target is sputtered in this way by the ionized atoms being accelerated by the electric field. The sputtered material is condensed on special substrates and forms a semiconductor thin film.

The optimal conditions of the Penning plasma generator can be obtained by application of magnetic and electric fields perpendicular to each other. The gas discharge also can be initiated in a high vacuum (this is the basic idea of the well-known Penning vacuum meter).

The Penning gas discharge being initiated in the space of a preliminary vacuum assures the flow of a gas discharge current which sometimes has an intensity an order of magnitude greater then the intensity of the same current in absence of the magnetic field. The speed of sputtering depends mainly on the current intensity; therefore the Penning discharge guarantees a speed of sputtering at least one order of magnitude greater then the speed of the afore-known sputtering processes.

The known Penning sputter sources contain a target which is connected as cathode, a cooling system, a field-magnet or exciting magnet, an anode which is separated from the cathode, and a screen system which preferably forms an outer housing of the device. The screen system may be formed for example from copper. The target must be cooled owing to the unavoidable heating effect of the current supplying the sputter source, such that the water cooling is generally used. The magnetic field is generated by a permanent magnet or by an electromagnet which is placed under and/or around the target. The target of the sputter source can be made for example in the form of a circle, a rectangle with broken corners, a racetrack consisting of two parallel direct lines and two half-circles being connected therewith, or even in the form of a triangle with broken corners. The sputtered area of the target forms the so-called active zone where the sputtering ions are impacted. The active zone can be produced from high-priced materials forming a thin upper layer of the target, while the rest of the target represents a support for the active zone.

The Penning sputter sources are available under different names, as S-gun, Planar Plasmatron, Planar Magnetron, Orbitorr etc.

The simplest types of the known Penning sources comprise a plain, generally disc-like target surrounded by a screen system which forms an anode. Under the target a permanent magnet is placed for generating a stable magnetic field. In this simple structure the conditions of plasma generating can be guaranteed only over a small surface area of the target. Therefore the active zone is of extremely limited dimensions. In this device, the distribution of the magnetic field is inhomogenous over the target; therefore the material to be sputtered is utilized unevenly, and the sputtering process remains of limited expansion.

Owing to the afore-mentioned disadvantages, a new-type Penning sputter source was constructed by the Varian Corp. (U.S.). This source is known under the trade name of S-gun and is described in detail by Vance and Hoffmann in "S-gun—a new sputtering system" (Varian Seminar, Palo Alto, 1978). This device is based on the use of a ring-like exciting magnet surrounding a conical target. The lines of the magnetic field are parallel to the conical surface of the target for a greater area then in the devices with a disc-like targets and this provides for an increase of the surface area of the active zone.

The construction of the target in the above device is ingenious. The target has dimensions sufficient to situate it in thermal contact with the surrounding cooling system. When the sputtering current results in an unavoidable thermal expansion of the target the thermal conduction to the cooling system is increased. In this device, the active zone has a greater surface and the conditions of the plasma generator are better then in the afore-known devices. A further new element of the S-gun type source lies in the central situation of the anode in comparison with the active zone.

The magnetic field is utilized in the S-gun type Penning sputter source with a low effectiveness because the exciting magnet is situated relatively far from the active zone. For increasing the intensity of the magnetic field the geometrical dimensions of the device must be increased. The conical form of the target can be a factor causing technological difficulties during its production, particularly in the case when different materials are used for the active zone and for the rest of the target.

All types of the known Penning sputter sources can be characterized by inhomogenous conditions of the plasma generator over the target and therefore by an unequal and disadvantageous erosion of the active zone during the sputtering process.

SUMMARY OF THE INVENTION

An object of the invention is to develop a Penning sputter source which provides the main disadvantages of the known devices and permits an increase of the active zone surface and uniform utilization thereof.

The invention is based on the perception that the surface of the active zone can be remarkably enlarged and over the enlarged active zone the perpendicularity of the electric and of the magnetic fields to each other can be guaranteed by means of a magnetic conductor supporting at least one suitably displaced auxiliary magnet, wherein the magnetic conductor is situated under and suitably around the target. The auxiliary magnet(s) can compensate for the decrease of the magnetic field of the exciting magnet; therefore the magnetic field has a relatively homogenous distribution over the device in which the intensity has only a slightly decreasing value.

An embodiment of the invention is a Penning sputter source comprising a screen system forming an outer housing, an anode, a cathode, an exciting magnet and a cooling system which are placed in the housing, where the cathode is separated from the anode and forms a sputtering target, the cooling system is connected with the target, and the improvement wherein a magnetic conductor is magnetically coupled with the exciting magnet and on the magnetic conductor at least one auxiliary magnet is situated where the auxiliary magnet has a less magnetic intensity then the exciting magnet and its upper level lies under the upper level of the exciting magnet.

In the space over the proposed Penning sputter source the intensity of the magnetic field is homogenous and has only slightly decreasing value because of the compensating influence of the auxiliary magnet(s).

In an advantageous embodiment of the invented Penning sputter source the exciting magnet forms the anode being placed in an orifice in the inner part of the target, and the magnetic conductor surrounds the target under its upper level. It is advantageous to choose such dimensions of the target which are suitable to situate the target in cold stage in thermal contact with the cooling system so that expansion of the target during operation increases thermal conduction to the cooling system. By this solution the efficiency of the cooling is increased.

The target and the magnetic conductor can be made in the form of concentric circles, of rectangles with broken corners or of racetracks consisting of two parallel direct lines and two half-circles being joined to these lines.

It is advantageous also to make the magnetic conductor in the form of the target, with parallel outer lines.

In a further preferred embodiment of the invented Penning sputter source the auxiliary magnets are situated in rings being placed under the target having the form of a circle.

It is advantageous also to connect an outer magnetic conductor with the exciting magnet on its one side being further from the target wherein the outer magnetic conductor is parallel with the outer side of the magnetic conductor, wherein both magnetic conductors are separated from each other by a gap.

BRIEF DESCRIPTION OF THE DRAWING

Further objects, features and advantages of the invention will become better understood by the following detailed description when considered in conjunction with the accompanying drawings, wherein.

Figure 3:
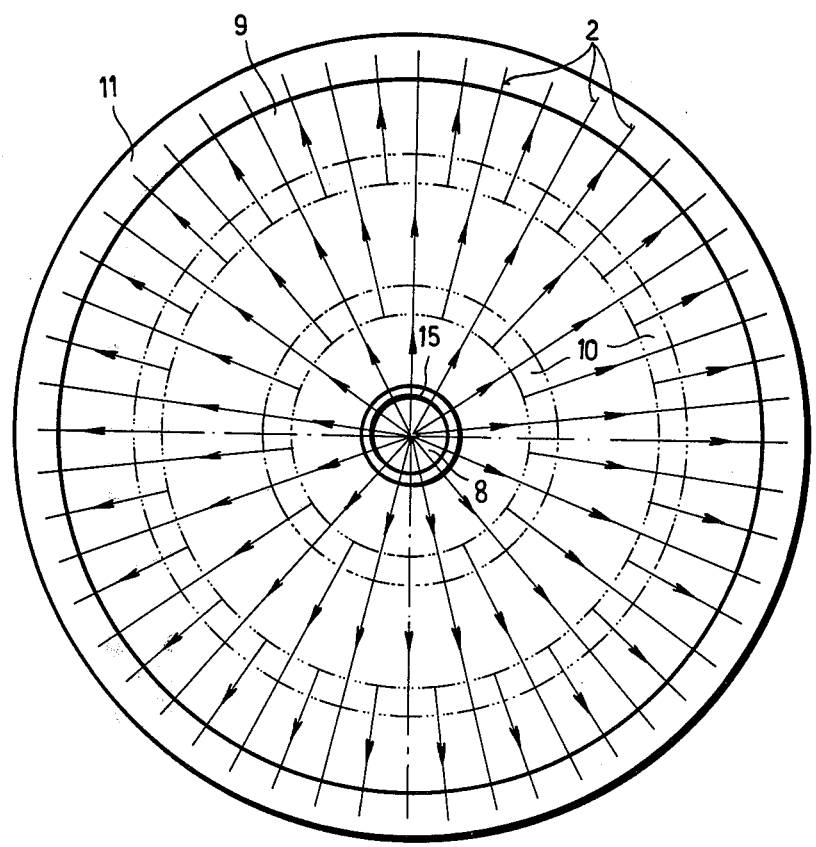
FIG. 3 shows schematically the magnetic field distribution over the presently invented Penning sputter source having a construction as shown in FIG. 2.
Figure 4:
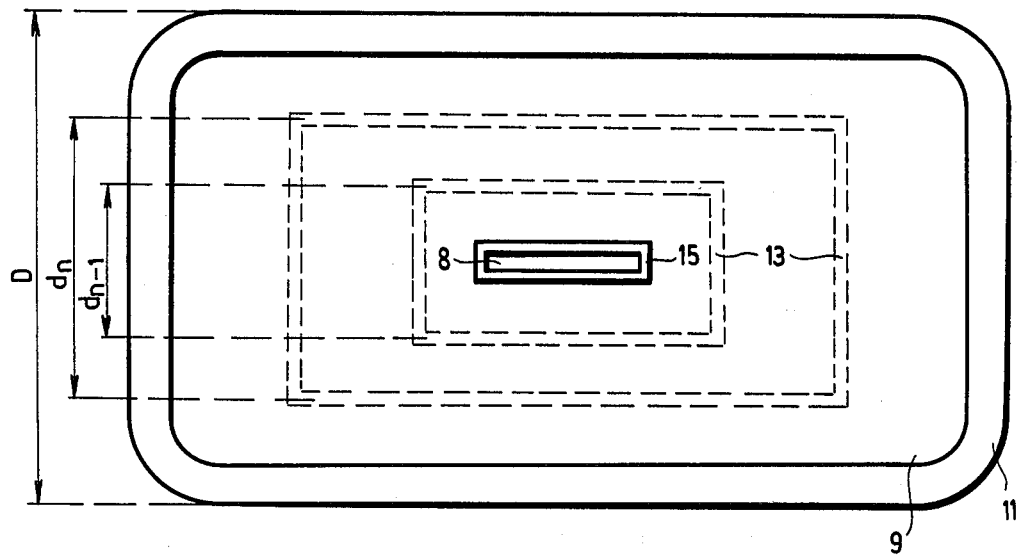
FIG. 4 is a top-view of an other preferred embodiment of the presently invented Penning sputter source with a rectangular target.
Figure 5:
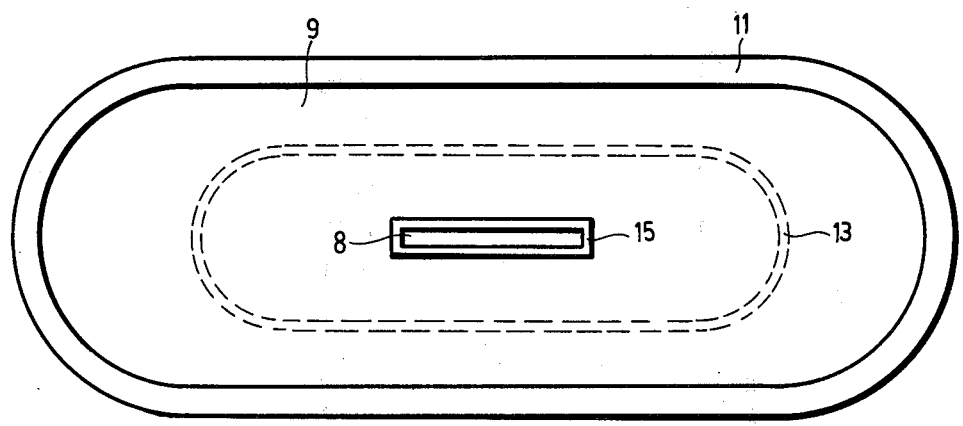
FIG. 5 is a top-view of a further preferred embodiment of the presently invented Penning sputter source having a racetrack-shaped target.

The embodiments of FIGS. 3, 4 and 5 are shown without a screen system.

DESCRIPTION OF THE PREFERRED EMBODIMENTS

Figure 1:
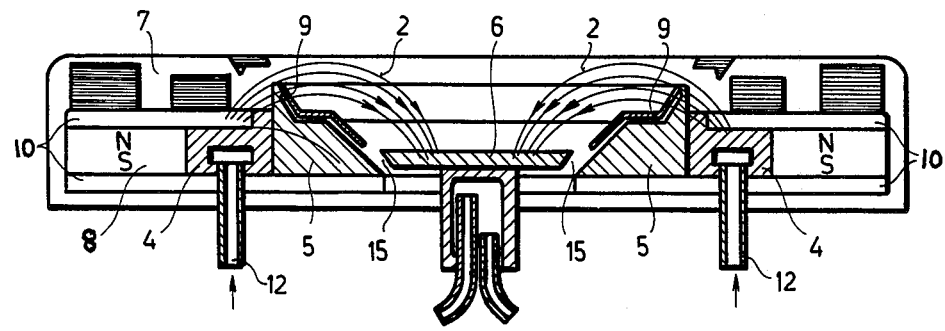
FIG. 1 is an axial vertical cross-section of a known Penning sputter source being produced by the Varian Corp.

The S-gun type Penning sputter source being produced by Varian Corp. (U.S.) comprises (FIG. 1) a screen system 7, rings 10 formed of a magnetic material and surrounding an exciting magnet 8, an anode 6 placed in the central area of the device, and a cathode 5 placed around the anode 6 and separated therefrom. The ring 10 is connected to a cooling system 4 having a duct 12. During the sputtering the duct 12 is filled with a cooling liquid, preferably water. The cooling system 4 surrounds the cathode 5 having a conical form defining the target. An active zone 9 is constructed in the upper area of the target and this active zone 9 is sputtered by ions which are generated in the described way from the atoms of a charge gas (which are not shown in the drawing). The ions are directed onto the target by the magnetic field of the ring 10 and by the electric field between the anode 6 and of the cathode 5 which are separated from each other by a gap 15. The cathode 5 has a conical form; therefore the magnetic field—which is characterized by lines 2—is parallel to the active zone 9 of the target. The target is positioned in thermal contact with the cooling system 4 in the aforementioned way, whereby effective cooling is guaranteed.

A preferred embodiment of the presently invented Penning sputter source (FIG. 2) has a target 3 containing an active zone 9 which has an even surface. The active zone 9 and the target 3—as mentioned above—can be made from an identical material, but they can be suitably produced also from different materials when the thin active zone 9 consists of a high-cost material to be sputtered and the rest of the target 3 forms only a support for the active zone 9.

The cooling system 4 is connected to the target 3 in the afore-mentioned way. In the central area of the target 3 and the active zone 9 an exciting magnet 8 is placed which has a north-pole directed toward the active zone 9 and a south-pole directed oppositely. The exciting magnet 8 and the target 3 are separated from each other by a gap 15 and are surrounded by a magnetic conductor 11. The magnetic conductor 11 is separated electrically from the exciting magnet 8 by the gap 15, assuring a magnetic coupling therebetween. The upper level of the magnetic conductor 11 is under the upper level of the active zone 9. An outer magnetic conductor 14 is connected to the south-pole S of the exciting magnet 8 which is separated from the magnetic conductor 11 by a thin parallel gap. The outer magnetic conductor 14 is to assure a good electric isolation in the device and to increase the effectiveness of the magnetic coupling.

The invented Penning sputter source can be constructed also on the basis of targets and magnetic conductors of non-circular forms, for example in the form of a rectangle (FIG. 4) or of a racetrack (FIG. 5). On the magnetic conductor 11 at least one auxiliary magnet 13 is placed. The auxiliary magnet 13 surrounds the exciting magnet 8 and compensates the decrease of the intensity of the magnetic field being generated by the exciting magnet 8.

The presently invented Penning sputter source having a circular target may have an exciting magnet 8 in form of a rod (FIG. 3). In the case of rectangular or racetrack-formed targets 3 the exciting magnet 8 may have a long rectangular form and be placed in the longitudinal axle of the device.

In the case of the circular Penning sputter source according to the FIG. 3 embodiment it has been found that with a centrally placed exciting magnet 8 it is suitable to set the auxiliary magnet(s) 13 in ring(s) 10 and to choose the placement of the ring(s) so that the relation $$1.2 \frac{D - d_{n-1}}{D - d_n} \geq \frac{\theta_{n-1}}{\theta_n} > 0.5 \frac{D - d_{n-1}}{D - d_n}$$

is fulfilled. In this relation D is the outer diameter of the magnetic conductor 11, $d_n$ and $d_{n-1}$ are the average diameters of the n-th and of the (n−1)-th ring 10, and $\theta_n$ and $\theta_{n-1}$ are the magnetic potentials of the same rings. When n=1, $d_0$ must be displaced by 0 and $\theta_0$ is the magnetic potential of the exciting magnet 8.

As is shown in FIG. 3, the auxiliary magnets 13 placed in the rings 10 (being shown with broken lines) amplify the decreasing magnetic field of the exciting magnet 8. The suitably placed auxiliary magnets 13 equalize the magnetic field over the active zone, up to the outer line of the target 3.

In the cases of rectangular or racetrack-formed Penning sputter sources according to FIGS. 4 and 5, it has been found that the ratio of the length of the longer to the shorter sides of the rectangular target must be not less than 1.2. In the opposite case the circular target is more advantageous than these forms. The above relation can be interpreted for the rectangular and for the racetrack-formed Penning sputter sources, too. In this case D is the distance of the longer direct lines of the magnetic conductor 11, $d_n$ and $d_{n-1}$ are the similar distances for the n-th and for the (n−1)-th auxiliary magnet 13. When n=1, $d_0$ must be displaced by 0 and $\theta_0$ is the magnetic potential of the exciting magnet 8.

Figure 2:
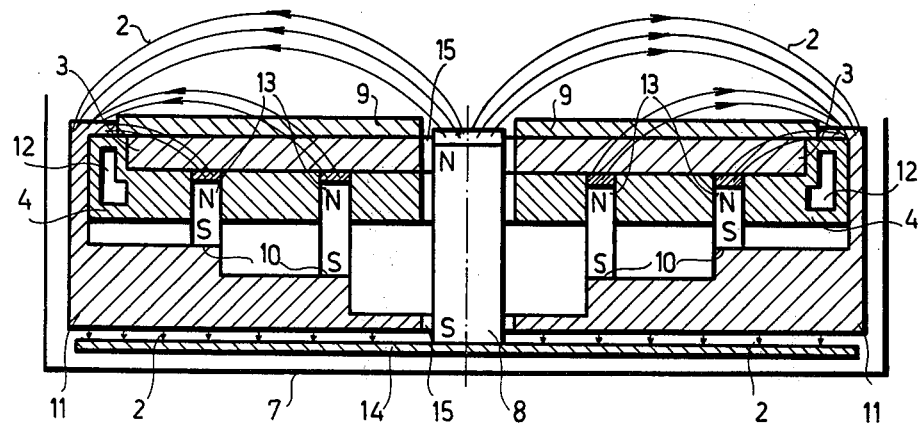
FIG. 2 is an axial vertical cross-section of a preferred embodiment of the presently invented Penning sputter source having a circular target.

The presently invented sputter source works in the following way:

The cathode 5 (being identical with the target 3 in FIG. 2) and the anode (being identical with the exciting magnet 8 of the preferred embodiment as shown in FIG. 2) are connected to a direct current supply unit (not shown) giving a direct current of preferable value within the range of 400 and 800 V. With an electric field being generated in this way, an approximately homogenous magnetic field is generated by the exciting magnet 8, by the magnetic conductor 11, by the auxiliary magnet(s) 13 and by the outer magnetic conductor 14. This magnetic field has an intensity of preferable value within the range of 0.01 and 0.025 T and is characterized by the lines 2 being perpendicular to the lines of the electric field (not shown). In this way, the conditions of Penning plasma generation are assured over the whole active zone 9. For initiating a gas-discharge the Penning sputter source must be placed in a preliminary vacuum of preferable value within the range of 0.1 and 1.2 Pa. This space must be filled with a suitably chosen discharge gas at the mentioned pressure. In the potential field of the cathode-drop the atoms of the discharge gas are ionized by the electrons being generated and accelerated by the electric field and directed also by the magnetic field. The ions are accelerated by the electric field and impacted onto the target 3 with a great speed, whereby they sputter the material of the active zone 9. The sputtered atoms can be condensed on suitably situated substrates; these atoms form a layer of approximately uniform thickness.

By changing the material of the active zone or the sequential use of different sputter sources and by regulation of their potential differences, different layers of required thickness and composition can be created. The condensation of these layers is accompanied by only a small quantity of released heat; therefore the sputtered thin films can be produced on practically all kinds of solid surfaces. By the proposed solution, uniform sputtering the surface of the active zone can be assured which assures a good effectiveness and productivity of the sputtering technologies.

Specific representative embodiments and refinements thereto have been discussed in the foregoing passages for the purpose of illustration, but it will be apparent to one skilled in the art that various changes and modifications may be made thereto without departing from the spirit and scope of this invention.

What we claim is:

1. A Penning sputter source comprising a screen system forming an outer housing, an anode, a cathode, an exciting magnet, and a cooling system positioned within said housing, said cathode being separated from said anode and forming a target, said cooling system being connected to said target, a magnetic conductor magnetically coupled to said exciting magnet and separated therefrom, and at least one auxiliary magnet is situated on said magnetic conductor, wherein said at least one auxiliary magnet has a lower magnetic intensity than said exciting magnet and its upper level lies under the upper level of said exciting magnet.

2. The Penning sputter source as defined in claim 1, wherein said exciting magnet forms said anode, said exciting magnet is placed in an orifice of said target, and said magnetic conductor surrounds said target and is coupled with said target under its upper level.

3. The Penning sputter source as defined in claim 2, wherein said target and said magnetic conductor have a circular form.

4. The Penning sputter source as defined in claim 2, wherein said target and said magnetic conductor have a rectangular form with rounded corners and the ratio of the length of the longer and of the shorter sides of the rectangle is equal to at least 1.2.

5. The Penning sputter source as defined in claims 3 or 4, wherein said at least one auxiliary magnet has an outer line parallel with the outer line of said target.

6. The Penning sputter source as defined in claim 3, wherein said auxiliary magnet is in the form of a ring.

7. The Penning sputter source as defined in claim 3, wherein one auxiliary magnet is placed on said magnetic conductor and for the outer diameter D of said magnetic conductor, for the average diameter d of said auxiliary magnet, for the magnetic potential $\theta$ of said exciting magnet and for the magnetic potential $\theta_1$ of said auxiliary magnet the relation $$1.2 \, \frac{D}{D-d} \geq \frac{\theta_0}{\theta_1} > 0.5 \, \frac{D}{D-d}$$

is fulfilled.

8. The Penning sputter source as defined in claim 3, wherein at least two auxiliary magnets are placed on said magnetic conductor and, for the outer diameters D of said magnetic conductor, for the average diameters $d_n$ and $d_{n-1}$ of the n-th and of the (n−1)-th auxiliary magnets, and for the magnetic potentials $\theta_n$ and $\theta_{n-1}$ of the same auxiliary magnets the relation $$1.2 \, \frac{D - d_{n-1}}{D - d_n} \geq \frac{\theta_{n-1}}{\theta_n} > 0.5 \, \frac{D - d_{n-1}}{D - d_n}$$

is fulfilled, and in the case of n=1, $d_0$ is displaced by 0 and $\theta_0$ is the magnetic potential of said exciting magnet.

9. The Penning sputter source as defined in claims 4 or 5, wherein one auxiliary magnet is placed on said magnetic conductor, and for the distance D of the longer direct lines of said magnetic conductor, for the distance d of the longer direct lines of said auxiliary magnet, for the magnetic potential $\theta_0$ of said exciting magnet and for the magnetic potential $\theta_1$ of said auxiliary magnet the relation $$1.2 \, \frac{D}{D-d} \geq \frac{\theta_0}{\theta_1} > 0.5 \, \frac{D}{D-d}$$

is fulfilled.

10. The Penning sputter source as defined in the claims 4 or 5, wherein at least two auxiliary magnets are placed on said magnetic conductor, and for the distance D of the longer direct lines of said magnetic conductor for the distances $d_n$ and $d_{n-1}$ of the longer direct lines of the n-th and of the (n−1)-th auxiliary magnets and for the magnetic potentials $\theta_n$ and $\theta_{n-1}$ of the same auxiliary magnets the relation $$1.2 \, \frac{D - d_{n-1}}{D - d_n} \geq \frac{\theta_{n-1}}{\theta_n} > 0.5 \, \frac{D - d_{n-1}}{D - d_n}$$

is fulfilled, and in the case of n=1, $d_0$ is displaced by 0 and $\theta_0$ is the magnetic potential of said exciting magnet.

11. The Penning sputter source as defined in claim 2, wherein said cooling system is placed under said magnetic conductor and said target is seated into the cooling system.

12. The Penning sputter source as defined in claim 2, wherein an outer magnetic conductor is connected with said exciting magnet and is placed on the opposite side of said exciting magnet as said target, and said outer magnetic conductor is separated from said magnetic conductor by a gap.

13. The Penning sputter source as defined in claim 2, wherein said target and said magnetic conductor are in the form of a racetrack being composed of two parallel direct lines interconnected at their respective ends by half circles, and wherein the ratio of the length of the longer and of the shorter sides of the racetrack is equal to at least 1.2.

* * * * *